United States Patent [19]
DiIorio et al.

[11] Patent Number: 5,962,866
[45] Date of Patent: Oct. 5, 1999

[54] MICROBRIDGE SUPERCONDUCTOR DEVICE UTILIZING STEPPED JUNCTIONS

[75] Inventors: Mark S. DiIorio; Shozo Yoshizumi; Kai-Yueh Yang, all of San Diego, Calif.

[73] Assignee: Biomagnetic Technologies, Inc., San Diego, Calif.

[21] Appl. No.: 08/671,512

[22] Filed: Jun. 27, 1996

Related U.S. Application Data

[63] Continuation-in-part of application No. 08/344,273, Nov. 22, 1994, which is a continuation of application No. 07/894,079, Jun. 5, 1992, Pat. No. 5,367,178, which is a continuation of application No. 07/644,905, Jan. 22, 1991, Pat. No. 5,134,117.

[51] Int. Cl.$^6$ ............... H01L 29/06; H01L 31/0256; H01L 39/22
[52] U.S. Cl. ............... 257/33; 257/31; 257/32; 505/190; 505/238; 505/329
[58] Field of Search ............... 257/31, 32, 33, 257/35; 505/190, 238, 329, 702

[56] References Cited

U.S. PATENT DOCUMENTS 4,925,829  5/1990  Fujita et al. .

FOREIGN PATENT DOCUMENTS 1-161786  6/1989  Japan ............... 257/34
1-241874  9/1989  Japan ............... 257/34

OTHER PUBLICATIONS

C. B. Eom et al., "Epitaxial and Smooth Films of a–Axis YBa2Cu3O7", Science, vol. 249, pp. 1549–1552, Sep. 1990.
John Clark, "Advances in SQUID Magnetometers", *IEEE Trans. Electron Devices,* vol. ED–27, No. 10, Oct. 1980, pp. 1896–1908.

M.B. Ketchen, "DC SQUIDS 1980: The State of the Art", *IEEE Trans. on Magnetics,* vol. MAG–17, No. 1, Jan. 1981, pp. 387–394.

C.B. Eom et al., "Synthesis and properties of $YBa_2Cu_3O_7$ thin films grown in situ by 90° off–axis single magnetron sputtering," *Physica C,* 1990, pp. 354–382.

M.A. Beno et al., "Structure of the single–phase high–temperature superconductor $YBa_2Cu_3O_{7-\delta}$", *Appl. Phys. Lett,* vol. 51(1), 1987, pp. 57–59.

C.B. Eom et al., "A–Axis–Oriented $YBa_2Cu_3O_7$/ $PrBa_2Cu_3O_7$ Superlattices", *Science,* vol. 251, 1991, pp. 780–783.

*Primary Examiner*—Mahshid Saadat
*Assistant Examiner*—Allan R. Wilson
*Attorney, Agent, or Firm*—Gregory Garmong

[57] ABSTRACT

A superconductor device has a substrate with an inclined surface that divides the substrate surface into a lower planar substrate surface and an upper planar substrate surface. A lower layer of an anisotropic superconductor material is epitaxially deposited on the lower planar substrate surface so that an a-axis of the anisotropic superconductor material of the lower layer is exposed at a top edge of the lower layer. An upper layer of an anisotropic superconductor material is epitaxially deposited on the upper planar substrate surface so that an a-axis of the anisotropic superconductor material of the upper layer is exposed at a top edge of the upper layer. A layer of a non-superconductor material overlies the inclined surface and the layers of anisotropic superconductor material.

20 Claims, 4 Drawing Sheets

ABSTRACT

MICROBRIDGE SUPERCONDUCTOR DEVICE UTILIZING STEPPED JUNCTIONS

This application is a continuation-in-part of pending application Ser. No. 08/344,273, filed Nov. 22, 1994, for which priority is claimed; which is a continuation of application Ser. No. 07/894,079, filed Jun. 5, 1992, now U.S. Pat. No. 5,367,178, for which priority is claimed; which is a continuation of application Ser. No. 07/644,905, filed Jan. 22, 1991, now U.S. Pat. No. 5,134,117, for which priority is claimed.

This invention relates to superconducting devices, and, more particularly, to a microbridge superconductor device incorporating a high-temperature superconductor material.

High-temperature superconductor materials are those having a normal-to-superconducting transition temperature, also known as $T_c$, of more than about 77 K, the boiling point of liquid nitrogen. At temperatures below its $T_c$, the superconducting material exhibits no resistance to the passage of electrical currents. The discovery of high-temperature superconductor materials has led to the possibility of many new applications of superconductors, because of the lower cooling and insulation requirements of the high-temperature superconductors as compared with conventional low-temperature superconductors.

The most important high-temperature superconductors discovered to date have been complex oxide compounds. These materials may be fabricated by depositing a thin film having the required composition of the metallic elements and either simultaneously or subsequently oxidizing the thin film to the required oxidation state. As an example, one of the known high-temperature superconductor materials is $YBa_2Cu_3O_{7-x}$, where x is selected such that the compound is superconducting and is typically small, on the order of about 0.1.

To utilize the high-temperature superconducting materials, they must be fabricated into devices and products. An initial step in this utilization is to determine whether the high-temperature superconductors can be directly substituted for conventional low-temperature superconductors. To make this determination, an existing device that utilizes the well-known low temperature superconductors is constructed, substituting the high-temperature superconductor materials for the low-temperature superconductor materials, and its operation is evaluated. For example, in one application it is desirable to construct a thin-film microbridge superconducting device having Josephson junctions therein for use in manufacturing a detector such as a superconducting quantum interference device (SQUID). A SQUID made with a high-temperature superconductor in the Josephson junctions could be operable at temperatures as high as the $T_c$ of the superconductor, which is above 77 K, and therefore could be used in numerous applications that do not require cooling to near-absolute zero.

U.S. Pat. No. 4,454,522 discloses a thin-film microbridge superconducting device in which superconducting layers are deposited upon a stepped substrate. A layer of normal material (that is, not superconducting at the temperature of operation of the superconducting layers) is deposited overlying the superconducting layers. The gap between the superconducting layers along the step creates a microbridge that is the basis for a Josephson junction. The superconducting layers can be further patterned to produce a loop and leads, thereby creating a SQUID.

Unfortunately, the approach of the '522 patent is intrinsically not suited for producing an operable SQUID utilizing the anisotropic high-temperature superconducting materials such as a complex oxide. There nevertheless remains a need for a thin-film microbridge and a fabrication technique for its production. The present invention fulfills this need, and further provides related advantages.

SUMMARY OF THE INVENTION

The present invention resides in a thin-film microbridge superconductor device using high-temperature superconductors, constituting a thin-film Josephson junction which can be used in a SQUID or other device operable in the temperature range from 4.2 K (and possibly even lower) to the critical temperature of the superconductor, above 77 K.

In accordance with the invention, a microbridge superconductor device comprises a substrate having a lower planar substrate surface, an inclined surface having an overall upward inclination of from about 20 to about 80 degrees from the plane of the lower planar substrate surface, and an upper planar substrate surface parallel to the lower planar substrate surface and separated from the lower planar substrate surface by the inclined surface. A lower layer of an anisotropic superconductor material, having a c-axis and an a-axis, is deposited on the lower planar substrate surface and is epitaxially related thereto. The anisotropic superconductor material is oriented such that the c-axis is not perpendicular to the lower planar substrate surface. An upper layer of the anisotropic superconductor material is deposited on the upper planar substrate surface and is epitaxially related thereto. The anisotropic superconductor material is oriented such that the c-axis is not perpendicular to the upper planar substrate surface. There is a gap between the lower layer of the anisotropic superconductor and the upper layer of the anisotropic superconductor. A layer of a non-superconductor (i.e., normal) material overlies the inclined surface in the gap and the layers of anisotropic superconductor material.

Many of the high-temperature (high-$T_c$) superconductor materials are highly anisotropic in their crystallographic structure. The high-temperature superconductors are complex compounds that crystallize into well-defined structures, but the structures are not the isotropic crystallographic structures found in most low-temperature superconductor materials. Instead, many of the high-$T_c$ compounds crystallize as regularly repeating stacks of copper-oxygen planes of a characteristic structure, with various atomic arrangements between the planes. The direction perpendicular to the copper-oxygen plane is termed the "c-axis". Any direction perpendicular to the c-axis (i.e., parallel to the copper-oxygen planes) is termed herein an "a-axis".

In such an anisotropic superconductor, the superconductivity coherence length is greater in the a-axis directions (e.g., 12–15 Angstroms) than in the c-axis direction (e.g., 2–3 Angstroms). An important consequence of this anisotropy is that a thin degraded layer intrinsically present, or present du[]e to the effects of processing, on the exposed upper surface of a c-axis oriented layer (the surface perpendicular to the c-axis direction) prevents superconductivity from penetrating due to the very short c-axis coherence length. The short coherence length may prevent the inducing of superconductivity in an adjacent normal metal layer, which itself has a relatively long coherence length. Such coupling is more easily achieved through the exposed a-axis edge of the superconducting layer, where the a-axis direction is exposed and the longer a-axis coherence length reduces the likelihood of problems due to a thin degraded layer. The coupling is achieved by the proximity effect, wherein superconductivity can be induced for a distance of up to a few thousand Angstroms or more in a normal metal layer adjacent a superconducting material. The anisotropy in the coherence length of the high-$T_c$ superconductors, in particular the extraordinarily short c-axis coherence length, is believed to be a primary cause of the inability to produce high-$T_c$ superconductor devices incorporating high-$T_c$ c-axis oriented superconductor materials using the approach of U.S. Pat. No. 4,454,522.

In the approach of the present invention, the high-temperature superconductor material is deposited as a layer on a substrate having an inclined surface. The substrate and deposition conditions are chosen to obtain the desired c-axis orientation of the high-temperature superconductor. For the commercially important high-$T_c$ superconductor material $YBa_2Cu_3O_{7-x}$, the preferred substrate materials are $LaAlO_3$ and $SrTiO_3$.

The present invention provides a microbridge device operable in the superconducting state over the temperature range from 4.2 K (and possibly even lower) to the $T_c$ for the superconductor material, typically well above 77 K, and a technique for its fabrication. Other features and advantages of the invention will be apparent from the following more detailed description of the preferred embodiments, taken in conjunction with the accompanying drawings, which illustrate, by way of example, the principles of the invention.

DETAILED DESCRIPTION OF THE PREFERRED EMBODIMENTS

In accordance with a preferred embodiment of the invention, a microbridge superconductor device comprises a substrate having an inclined surface thereon, the inclined surface dividing the substrate surface into a lower planar substrate surface and an upper planar substrate surface. There is a loop on the surface of the substrate that intersects the inclined surface at two junction locations. The loop comprises a superconductor layer of an anisotropic superconductor material epitaxially deposited overlying the lower planar substrate surface with the c-axis not perpendicular to the plane of the lower substrate surface and the upper planar substrate surface with the c-axis not perpendicular to the plane of the upper substrate surface, and a layer of normal material deposited overlying the inclined surface and contacting the superconductor layer at the two junction locations.

Figure 1:
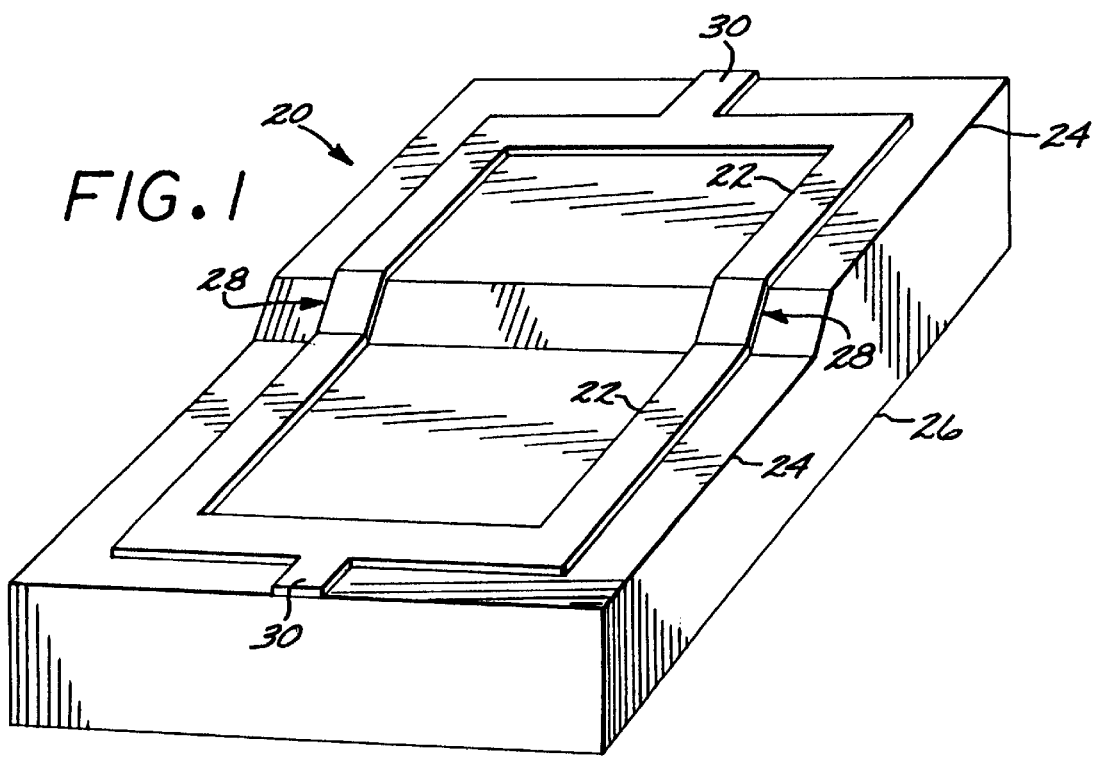
FIG. 1 is a perspective view of a SQUID device having a microbridge therein.

Referring to FIG. 1, a thin-film Superconducting QUantum Interference Device (SQUID) 20 includes a patterned loop of superconductor material 22 arranged on the two substrate surfaces 24 of a substrate 26. (The substrate 26 may be a free-standing article or a layer deposited on a base.) Microbridge junctions 28 (Josephson junctions) are located between the portions of the loop 22 on the upper and lower substrate surfaces 24. Leads 30 extend from the portions of the loop 22 on the upper and lower substrate surfaces 24. There may be either two junctions 28 in the loop 22, forming a dc SQUID, or one junction 28 in the loop 22, forming an rf (radio frequency) SQUID. The general structure and functioning of SQUIDs are well known. See, for example, "Advances in SQUID Magnetometers" by John Clarke, IEEE Trans. Electron Devices, Vol. ED-27, page 1896 (1980) and "DC SQUIDs 1980: The State of the Art", by M. B. Ketchen, IEEE Trans. Magnetics, Vol. MAG-17, page 307 (1981).

Figure 2:
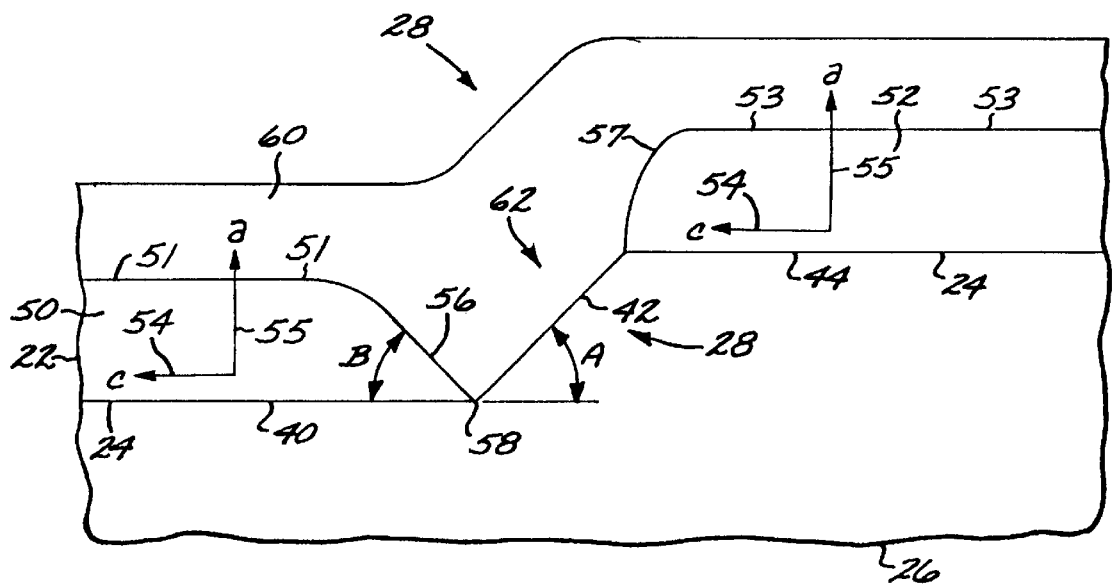
FIG. 2 an enlarged side elevational view of a portion of one embodiment of the device of FIG. 1, illustrating the structure of the microbridge.

FIG. 2 illustrates the structure of one of the junctions 28 and a portion of the loop 22 in greater detail, according to one embodiment of the invention. The substrate 26 has the two substrate surfaces 24, which may be described more precisely as two planar surfaces separated by an inclined surface. A lower planar substrate surface 40 (which forms one of the substrate surfaces 24) is located at a "lower" height of the substrate 26, when the substrate is placed in an upwardly facing orientation as shown in FIG. 2. An inclined surface 42 is angled upwardly at an angle A of from about 20 to about 80 degrees from the plane of the lower planar substrate surface 40. At the top of the inclined surface 42, an upper planar substrate surface 44 is parallel to the lower planar substrate surface 40. The two planar substrate surfaces 40 and 44 are thus separated by the inclined surface 42. (This inclined surface 42 is to be contrasted with the generally perpendicular step, called the step 16, of U.S. Pat. No. 4,454,522, whose disclosure is incorporated by reference.)

A layer of an anisotropic superconductor material 50 is deposited upon the lower planar substrate surface 40, and a layer of the superconductor material 52 is deposited upon the upper planar substrate surface 44. After patterning into a loop, the layers 50 and 52 become part of the loop 22 of FIG. 1. The layers 50 and 52 are typically deposited simultaneously and of the same high-$T_c$ material, but are most conveniently discussed as two separate elements. In this embodiment, the layers 50 and 52 are deposited with a c-axis 54 of the superconductor material parallel to the plane of the surfaces 40 and 44 and an a-axis 55 of the superconductor material perpendicular to the plane of the surfaces 40 and 44. Thus, the layer 50 has a horizontally extending a-axis exposed edge 51 of the anisotropic superconductor material at the top of the layer 50. The layer 52 has a horizontally extending a-axis exposed edge 53 of the anisotropic superconductor material at the top of the layer 52.

A surface 56 of the layer 50 is beveled or angled backwardly away from the inclined surface 42. The angle B of the bevel is less than 90 degrees, and is preferably less than about 70 degrees. The upper layer 52 has a corresponding surface 57 at the end of the layer adjacent the inclined surface 42. Although the surface 57 is normally slightly beveled away from the inclined surface 42 as shown, it need not be.

A normal layer 60 of a non-superconducting material is deposited overlying the layers 50 and 52, and the exposed portion of the substrate 26. A gap 62, between the a-axis exposed portions of the respective layers 50 and 52 through the intervening portion of the normal layer 60, defines the superconductor-to-normal-material-to-superconductor (SNS) microbridge junction 28.

The a-axis exposed edges 51 and 53 are so named because they constitute conducting surfaces, through which an electrical current may flow, between the normal material of the layer 60 and the superconducting material of the layers 50 and 52. The a-axis exposed edges 51 and 53 expose a component of the a-axis face of the anisotropic high-$T_c$ superconductor material. The microbridge junction devices 28 are fabricated in a manner, to be described, that ensures a good contact between the a-axis exposed edges 51 and 53, and the normal material layer 60. The current flow path of the junction 28 is therefore from one edge 51 or 53, through the normal material 60 (which is made locally superconducting according to the proximity effect), and through the other edge 53 or 51, respectively.

The high-$T_c$, anisotropic superconductor material of the layers 50 and 52 is preferably a complex superconducting oxide or other anisotropic material that exhibits superconductivity below some critical temperature. These materials are typically c-axis materials having a stacked-planar crystallographic structure with a c-axis perpendicular to the planes and a-axes lying in the planes, as discussed previously. This structure is described, for example, in M. B. Beno et al., Appl. Phys. Lett., vol. 51, page 57 (1987) and A. Williams et al., Phys. Rev., vol. B37, page 7960 (1988). A preferred material for the layers 50 and 52 is the high-$T_c$ superconductor $YBa_2Cu_3O_{7-x}$. The value of x is selected such that the compound is superconducting. The value of x is determined by the degree of oxidation, so that typically x is about 0.1. This material has a $T_c$ of about 90 K when deposited as a thin film. It may be epitaxially deposited so that the c-axis is not perpendicular to a substrate surface using techniques to be described, which include selection of a substrate 26 having lattice parameters that match within a few percent that of the crystallographic face perpendicular to the c-axis. A known material for achieving such growth is lanthanum aluminate, $LaAlO_3$. The selection of $LaAlO_3$ is preferred, and not limiting of the invention. Other substrate materials include $PrGaO_3$, $LaGaO_3$, $NdGaO_3$, $SrTiO_3$, MgO, $SrAl_{0.5}Ta_{0.5}O_3$, $Al_2O_3$, and yttria-stabilized zirconia. For other high-$T_c$ materials, $LaAlO_3$ or other substrate materials which produce epitaxial growth are selected. Examples of other suitable high-$T_c$ materials include $Bi_2Ca_2Sr_2Cu_3O_x$, $Tl_2Ba_2Ca_2Cu_3O_x$, $HgBa_2CaCu_2O_x$, and $HgBa_2Ca_2Cu_3O_x$, where x in each case is selected such that the compound is superconducting, as is known in the art for each compound. The values of x are typically about 10, 10, 6+δ, and 8+δ for these four examples, respectively.

The microbridge junctions 28 and SQUID 20 are preferably fabricated by the following approach, which is illustrated pictorially in FIG. 3. A single crystal piece of $LaAlO_3$ is provided as the substrate 26 with its surface having a (100) crystallographic orientation, FIG. 3A. That surface is first etched to form the planar surfaces 40 and 44, with the inclined surface 42 between them. The etching procedure includes depositing a metal film 70 that will act as a mask onto the surface of the substrate 26, FIG. 3B. The metal film is preferably either niobium in a thickness of about 2000 to about 4000 Angstroms (Å), or molybdenum in a thickness of from about 2000 Angstroms to about 4000 Angstroms, deposited by sputtering. The metal film 70 is patterned with a step by depositing a standard photoresist material onto the film, exposing a pattern into the photoresist, and removing the exposed portion of the photoresist. The step 72 is formed in the exposed metal layer 70 by ion milling through the patterned photoresist material. Typical ion milling parameters are an ion beam energy of 400 electron volts, and a beam current density of 0.45 to 0.90 milliamps per square centimeter, resulting in an etching rate of 200–400 Angstroms per minute. The photoresist is then stripped by placing the patterned substrate into a solvent for the photoresist, leaving the structure shown in FIG. 3C.

Figure 3A:
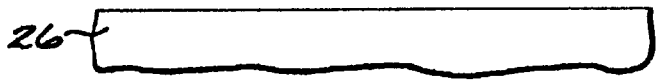
FIG. 3A–3G is a pictographic flow chart of the fabrication of a microbridge device, illustrating the structure at various points of the fabrication procedure.
Figure 3B:
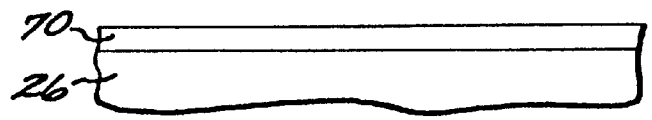
Figure 3C:
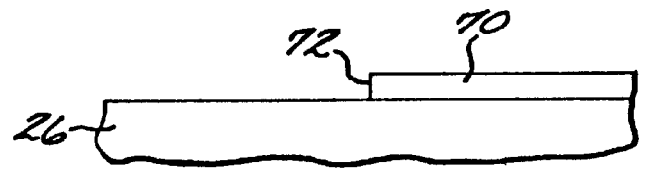
Figure 3D:
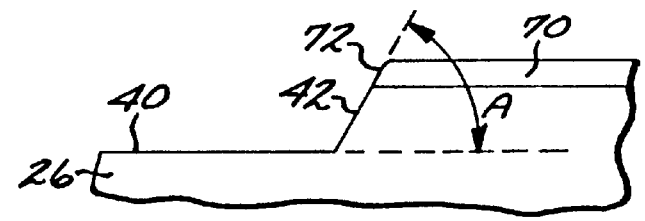
Figure 3E:
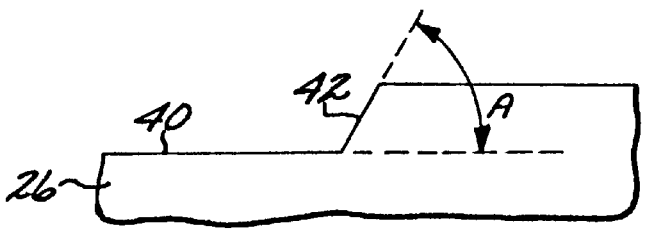
Figure 3F:
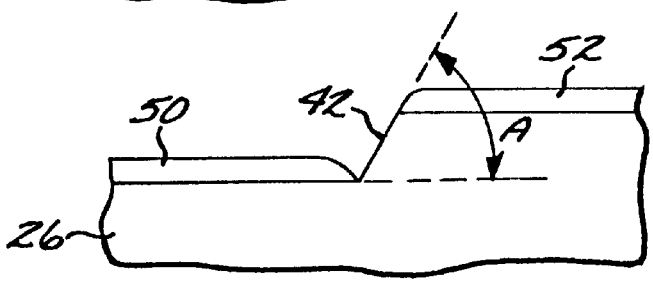

The step pattern in the metal mask is used to form the inclined surface 42 on the substrate by ion milling the masked substrate. The ion milling procedure produces the inclined surface 42, which lies at an angle A from the substrate 26, as shown in FIG. 3D, while still retaining the lower planar substrate surface in the (100) crystallographic orientation. Typical ion milling parameters are a beam energy of 400–500 electron volts and a beam current density of 0.2 to 1.8 milliamps per square centimeter. The resulting etching rate is typically about 400 Angstroms per minute. The perpendicular distance between the planar surfaces 40 and 44 is preferably from about 200 to about 3000 Angstroms. After the inclined surface has been ion milled into the substrate surface, the metal layer 70 is removed, FIG. 3E, by plasma etching in the case of niobium or etching in a wet etch acid solution of nitric acid, sulfuric acid, and water in the case of molybdenum.

The layers of superconducting material 50 and 52 are next deposited simultaneously onto the surface of the substrate 26. The layers 50 and 52 are preferably deposited by off-axis sputter deposition of $YBa_2Cu_3O_{7-x}$, see FIG. 3F. The thickness of the layers 50 and 52 is preferably from about 100 to about 2900 Angstroms. Typical sputter deposition parameters are a partial pressure of argon of 165 millitorr, a partial pressure of oxygen of 35 millitorr, a substrate temperature of 710° C., and a dc power of 90 watts. The transition temperature, $T_c$, of the resulting superconducting film is about 88 K.

Figure 3G:
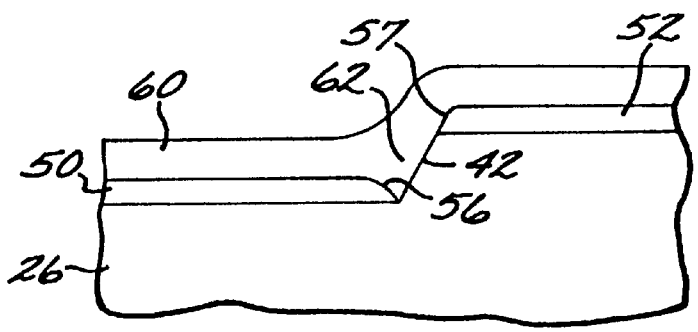

The normal layer 60 is deposited by sputtering immediately after the layers 50 and 52 are deposited, without removing the sample from the deposition chamber, as shown in FIG. 3G and FIG. 2. The normal layer may be a metal, a semi-metal, or a semiconductor. The preferred material for the layer 60 is a silver-gold alloy ($Ag_x$, $Au_{1-x}$, where 0<x<1), but could be another metal such as gold, or a low carrier density material such as 5% Nb-doped $SrTiO_3$ or $Sr_{1-x}Ca_xRuO_3$ (0≦x<1). The superconductor and normal metal sources are located behind shutters in the chamber, and the normal layer source is started prior to completion of the operation of the superconductor material source. The substrate is heated to 710° C. for superconductor deposition, but the heater setting is changed to reduce the substrate temperature to below about 550° C. for the silver-gold alloy deposition. The oxygen flow is stopped, and the chamber is evacuated to 125 millitorr. The substrate support and heater are then rotated so that the silver-gold alloy deposits over the inclined surface and joins the two superconducting film edges 56 and 57 through the gap 62 region. It is critical to achieve a good conducting path at the a-axis exposed edges 51 and 53. The preferred thickness of the layer 60 is from about 100 Angstroms to about 3000 Angstroms.

After the silver-gold alloy layer is deposited, the oxygen gas valve is reopened, and an oxygen pressure of about 750 Torr introduced into the chamber. The silver-gold alloy coated substrate is soaked in oxygen at a temperature of about 430° C. for 30 minutes. The oxygen treatment causes oxygen to diffuse through the silver-gold alloy normal layer 60 to the superconductor layers 50 and 52, reoxidizing the upper surfaces of the layers 50 and 52. This reoxidation is believed desirable, because during low-pressure deposition of the silver-gold alloy some of the oxygen at the upper surface of the layers 50 and 52 can diffuse out of the surface and be pumped away, leaving the upper surface of the layers 50 and 52 oxygen deficient. The $T_c$ value of the oxide superconductor falls with increasing values of x in the composition $YBa_2Cu_3O_{7-x}$, and therefore vacuum depletion of the upper surface of the layers 50 and 52 can cause these upper surfaces to become non superconducting, an undesirable result. Reoxidation of the upper surface, through the thin silver-gold alloy layer, ensures that a high value of $T_c$ will be achieved.

After the junctions 28 are completed in the manner just described, the loop conductor patterns 22 shown in FIG. 1 are formed by standard photoresist techniques. A layer of photoresist is deposited onto the upper surface of the layer 60, a loop pattern is photolithographically patterned into the photoresist layer, and the exposed portions are removed by ion milling to leave the pattern of loop 22 and leads 30, as well as the microbridge junctions 28. Typical ion milling conditions are a beam energy of 250 electron volts and a beam current density of 0.2 milliamps per square centimeter. The remaining photoresist pattern is then removed in an appropriate solvent, and the SQUID 20 is complete.

Figure 5:
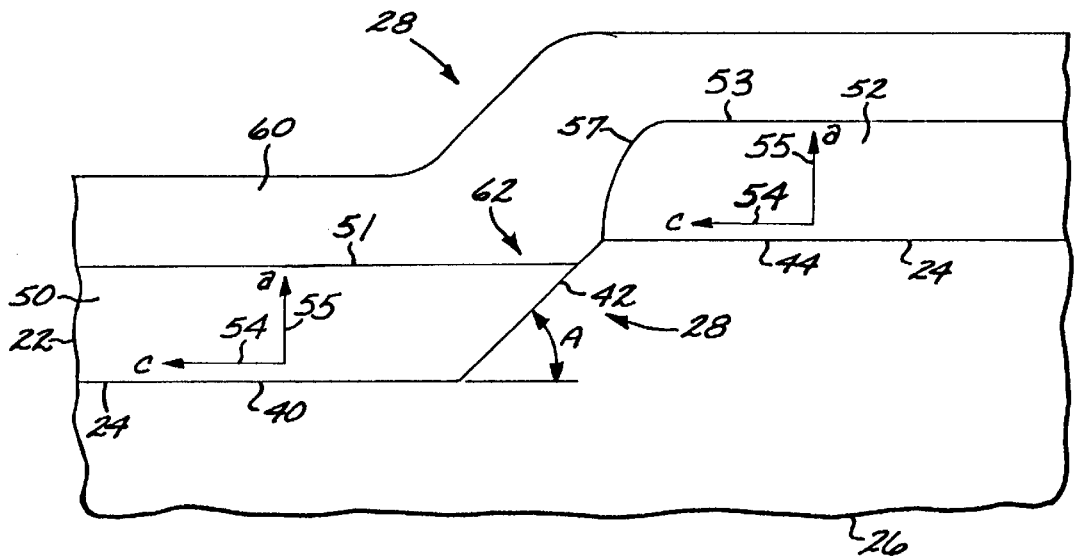
FIG. 5 is enlarged side elevational view similar to that of FIG. 2, illustrating a third embodiment of the microbridge.
Figure 4:
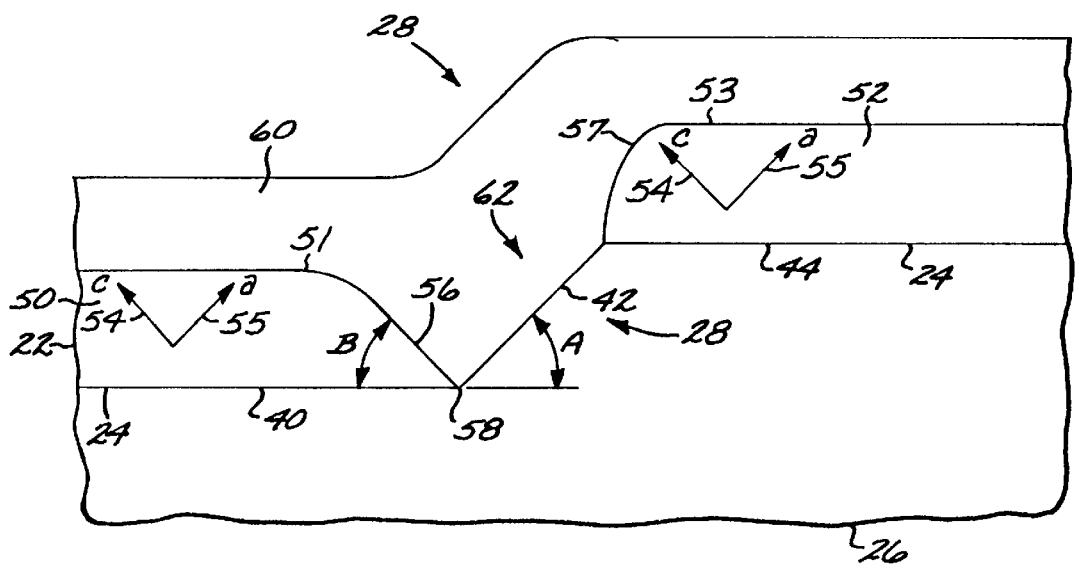
FIG. 4 is enlarged side elevational view similar to that of FIG. 2, illustrating a second embodiment of the microbridge.
Figure 6:
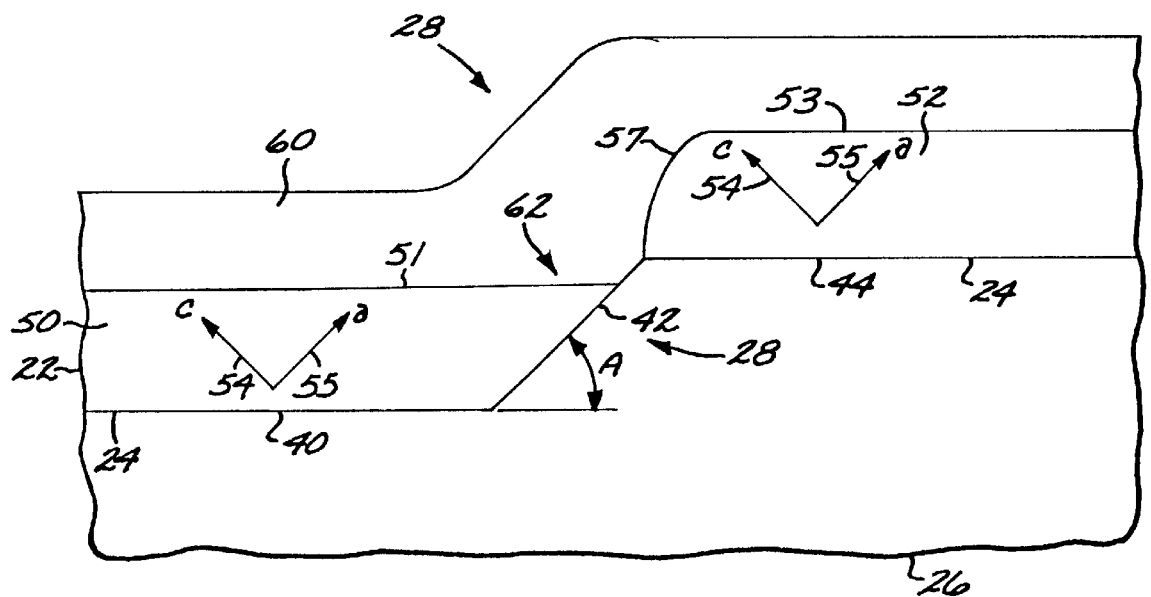
FIG. 6 is enlarged side elevational view similar to that of FIG. 2, illustrating a fourth embodiment of the microbridge.

This fabrication procedure is preferred, and does not exclude other operable fabrication procedures and their resulting junction structures. Three other structures of the junction region within the scope of the invention are shown in FIGS. 4–6, in which elements corresponding to those of FIG. 2 are identically numbered. In FIG. 4, the c-axis 54 of the anisotropic superconductor material is angled from 0 to 90 degrees relative to the surfaces 51 and 53. This orientation is produced by depositing the anisotropic superconductor material on substrates cut to have orientations between their major indices. See, for example, C. B. Eom et al., "Synthesis and properties of $YBa_2Cu_3O_{7-x}$ thin films grown in-situ by 90° off-axis single magnetron sputtering", *Physica C*, vol. 171, pages 351 et seq. (1990) and C. B. Eom et al., "Epitaxial and Smooth Films of $YBa_2Cu_3O_7$", *Science*, Vol. 251, pages 780 et seq. (1991).

The structure of FIG. 5 is similar to that of FIG. 2, except that the layer 50 extends to the inclined surface 42, without any beveling of an surface back from the incline. The structure of FIG. 6 is similar to that of FIG. 4, except that the layer 50 extends to the inclined surface 42, without any beveling of an surface back from the incline. The bevelling of the inclined surface is adjusted by changing the temperature of the substrate during the film deposition.

Eom (1991) has demonstrated that $YBa_2Cu_3O_{7-x}$ may be grown with an a-axis orientation as in FIG. 2, using a $LaAlO_3$ substrate with (100) crystallographic orientation and a temperature of 600–700° C. during deposition. Eom (1990) has demonstrated that $YBa_2Cu_3O_{7-x}$ may be grown with other a-axis orientations such as in FIGS. 4 and 6. Eom (1990) grew (103) and (113) oriented $YBa_2Cu_3O_{7-x}$ films using off-axis sputtering onto $SrTiO_3$ (110) and $SrTiO_3$ (111) substrates, respectively.

The present invention provides an important advance in the art of superconductimg microbridge devices utilizing high-temperature superconductors. Although particular embodiments of the invention have been described in detail for purposes of illustration, various modifications may be made without departing from the spirit and scope of the invention. Accordingly, the invention is not to be limited except as by the appended claims.

What is claimed is:

1. A microbridge superconductor device, comprising:
   a substrate having
      a lower planar substrate surface,
      an inclined substrate surface having an overall upward inclination of from about 20 to about 80 degrees from the plane of the lower planar substrate surface, and
      an upper planar substrate surface parallel to the lower planar substrate surface and separated from the lower planar substrate surface by the inclined substrate surface;
   a lower layer of an anisotropic superconductor material on the lower planar substrate surface and epitaxially related thereto, the anisotropic superconductor material having a c-axis and being oriented such that the c-axis is not perpendicular to the lower planar substrate surface;
   an upper layer of the anisotropic superconductor material on the upper planar substrate surface and epitaxially related thereto, the anisotropic superconductor material being oriented such that the c-axis is not perpendicular to the upper planar substrate surface, there being a gap between the lower layer of the anisotropic superconductor and the upper layer of the anisotropic superconductor; and
   a layer of a non-superconductor material overlying the inclined substrate surface in the gap and the layers of anisotropic superconductor material.

2. The superconductor device of claim 1, wherein the anisotropic superconductor material has a superconducting transition temperature greater than about 77 K.

3. The superconductor device of claim 1, wherein the anisotropic superconductor material is the compound $YBa_2Cu_3O_{7-x}$, where x is selected such that the compound is superconducting.

4. The superconductor device of claim 1, wherein the anisotropic superconductor material is selected from the group consisting of the compound $Bi_2Ca_2Sr_2Cu_3O_x$, $Tl_2Ba_2Ca_2Cu_3O_x$, $HgBa_2CaCu_2O_x$, and $HgBa_2Ca_2Cu_3O_x$, where x in each case is selected such that the compound is superconducting.

5. The superconductor device of claim 1, wherein the substrate comprises a layer deposited on a base.

6. The superconductor device of claim 1, wherein the substrate is selected from the group consisting of $LaAlO_3$, $PrGaO_3$, $LaGaO_3$, $NdGaO_3$, $SrTiO_3$, $MgO$, $SrAl_{0.5}Ta_{0.5}O_3$, $Al_2O_3$, and yttria-stabilized zirconia.

7. The superconductor device of claim 1, wherein the layers of anisotropic superconductor material define in plan view a loop that intersects the inclined substrate surface at two locations.

8. The superconductor device of claim 1, wherein the planes of the lower substrate surface and the upper substrate surface are separated by a distance of from about 200 to about 3000 Angstroms.

9. The superconductor device of claim 1, wherein the thickness of the upper and lower layers of the anisotropic superconductor material is from about 100 to about 2900 Angstroms.

10. The superconductor device of claim 1, wherein the non-superconductor material is selected from the group consisting of a metal, a semi-metal, and a semiconductor.

11. The superconductor device of claim 1, wherein the non-superconductor material is selected from the group consisting of silver, gold, a silver-gold alloy, $La_{0.5}Sr_{0.5}CoO_3$, $Sr_{1-x}Ca_xRuO_3$ ($0 \leq x \leq 1$), and 5% Nb-doped $SrTiO_3$.

12. The superconductor device of claim 1, wherein the c-axis of the lower layer of the anisotropic superconductor lies parallel to the lower planar substrate surface, and the c-axis of the upper layer of the anisotropic superconductor lies parallel to the upper planar substrate surface.

13. The superconductor device of claim 1, wherein the c-axis of the lower layer of the anisotropic superconductor is inclined at an angle of more than 0 but less than 90 degrees to the lower planar substrate surface, and the c-axis of the upper layer of the anisotropic superconductor is inclined at an angle of more than 0 but less than 90 degrees to the upper planar substrate surface.

14. A microbridge superconductor device, comprising:
  a substrate having an inclined substrate surface, the inclined substrate surface dividing the substrate surface into a lower planar substrate surface and an upper planar substrate surface;
  a lower layer of an anisotropic superconductor material, having an a-axis and a c-axis, epitaxially deposited on the lower planar substrate surface so that the a-axis of the anisotropic superconductor material of the lower layer is exposed at a top edge of the lower layer;
  an upper layer of an anisotropic superconductor material epitaxially deposited on the upper planar substrate surface so that the a-axis of the anisotropic superconductor material of the upper layer is exposed at a top edge of the upper layer; and
  a layer of a non-superconductor material overlying the inclined substrate surface and the layers of the anisotropic superconductor material.

15. The superconductor device of claim 14, wherein the lower layer and the upper layer of anisotropic superconductor material define in plan view a loop that intersects the inclined surface at two locations.

16. The superconductor device of claim 14, wherein the c-axis of the lower layer of the anisotropic superconductor lies parallel to the lower planar substrate surface, and the c-axis of the upper layer of the anisotropic superconductor lies parallel to the upper planar substrate surface.

17. The superconductor device of claim 14, wherein the c-axis of the lower layer of the anisotropic superconductor is inclined at an angle of more than 0 but less than 90 degrees to the lower planar substrate surface, and the c-axis of the upper layer of the anisotropic superconductor is inclined at an angle of more than 0 but less than 90 degrees to the upper planar substrate surface.

18. The superconductor device of claim 14, wherein the lower layer of anisotropic superconductor material is beveled away from the inclined substrate surface.

19. The superconductor device of claim 14, wherein the lower layer of anisotropic superconductor material is in contact with the inclined substrate surface.

20. A microbridge superconductor device, comprising:
  a substrate having an inclined substrate surface, the inclined substrate surface dividing the substrate surface into a lower planar substrate surface and an upper planar substrate surface; and
  a loop on the substrate surface that intersects the inclined substrate surface at two junction locations, the loop comprising
    a superconductor layer of an anisotropic superconductor material epitaxially deposited overlying the lower planar substrate surface with the c-axis not perpendicular to the plane of the lower substrate surface and the upper planar substrate surface with the c-axis not perpendicular to the plane of the upper substrate surface, and
    a layer of normal material deposited overlying the inclined substrate surface and contacting the superconductor layer at the two junction locations.

* * * * *